United States Patent
Jayashankar et al.

(10) Patent No.: US 10,971,180 B2
(45) Date of Patent: Apr. 6, 2021

(54) METHODS OF FORMING NEAR FIELD TRANSDUCERS AND NEAR FIELD TRANSDUCERS FORMED THEREBY

(71) Applicant: SEAGATE TECHNOLOGY LLC, Cupertino, CA (US)

(72) Inventors: Sethuraman Jayashankar, Excelsior, MN (US); Sarbeswar Sahoo, Shakopee, MN (US)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 15/638,453

(22) Filed: Jun. 30, 2017

(65) Prior Publication Data
US 2017/0337943 A1 Nov. 23, 2017

Related U.S. Application Data (63) Continuation of application No. 14/561,825, filed on Dec. 5, 2014, now Pat. No. 9,697,856.

(60) Provisional application No. 61/912,796, filed on Dec. 6, 2013.

(51) Int. Cl.
| | |
|---|---|
| *G11B 5/60* | (2006.01) |
| *G11B 5/31* | (2006.01) |
| *G11B 5/00* | (2006.01) |
| *C23C 14/48* | (2006.01) |

(52) U.S. Cl.
CPC ............ *G11B 5/6088* (2013.01); *C23C 14/48* (2013.01); *G11B 5/314* (2013.01); *G11B 2005/0021* (2013.01)

(58) Field of Classification Search
CPC ............ G11B 2005/0021; G11B 5/314; G11B 5/6088
See application file for complete search history.

(56) References Cited

U.S. PATENT DOCUMENTS

| | | | |
|---|---|---|---|
| 4,492,873 A | | 1/1985 | Dmitriev et al. |
| 5,476,691 A | * | 12/1995 | Komvopoulos .... C04B 41/0027 |
| | | | 427/127 |
| 5,482,611 A | | 1/1996 | Helmer et al. |
| 5,849,093 A | | 12/1998 | Andrae |
| 5,945,681 A | | 8/1999 | Tokiguchi |
| 6,130,436 A | | 10/2000 | Renau |

(Continued)

FOREIGN PATENT DOCUMENTS

| | | |
|---|---|---|
| EP | 024088 | 10/1987 |
| EP | 0580368 | 1/1994 |

(Continued)

OTHER PUBLICATIONS

Periodic Table. http://www.sbcs.qmul.ac.uk/iupac/AtWt/table.html (Year: 2013).*

(Continued)

*Primary Examiner* — Dah-Wei D. Yuan
*Assistant Examiner* — Kristen A Dagenais-Engelhart
(74) *Attorney, Agent, or Firm* — Mueting Raasch Group (57) ABSTRACT

A method of forming a near field transducer (NFT), the method including the steps of depositing a primary material; and implanting a secondary element, wherein both the primary material and the secondary element are chosen such that the primary material is densified via implantation of the secondary element.

19 Claims, 7 Drawing Sheets

(56) References Cited

U.S. PATENT DOCUMENTS

| | | |
|---|---|---|
| 6,144,098 A | 11/2000 | Iyer |
| 6,589,676 B1 | 7/2003 | Gui |
| 6,632,483 B1 | 10/2003 | Callegari |
| 6,641,932 B1 | 11/2003 | Xu |
| 6,683,426 B1 | 1/2004 | Kleeven |
| 6,795,630 B2 | 9/2004 | Challener |
| 6,999,384 B2 | 2/2006 | Stancil |
| 7,002,228 B2 | 2/2006 | Deak |
| 7,018,729 B2 | 3/2006 | Pocker |
| 7,032,427 B2 | 4/2006 | Niwa |
| 7,262,936 B2 | 8/2007 | Hamann |
| 7,272,079 B2 | 9/2007 | Challener |
| 7,330,404 B2 | 2/2008 | Peng |
| 7,377,228 B2 | 5/2008 | Mack |
| 7,476,855 B2 | 1/2009 | Huang |
| 7,538,978 B2 | 5/2009 | Sato |
| 7,544,958 B2 | 6/2009 | Low |
| 7,609,003 B2 | 10/2009 | Horsky |
| 7,690,009 B2 | 3/2010 | Miyanishi |
| 7,791,839 B2 | 9/2010 | Olson |
| 7,961,417 B2 | 6/2011 | Seigler |
| 7,965,464 B2 | 6/2011 | Batra |
| 7,986,592 B2 | 7/2011 | Hirano |
| 8,023,225 B2 | 9/2011 | Shimazawa |
| 8,031,561 B2 | 10/2011 | Hellwing |
| 8,040,761 B2 | 10/2011 | Kawamori |
| 8,077,556 B2 | 12/2011 | Komura |
| 8,107,325 B2 | 1/2012 | Komura |
| 8,115,421 B2 | 2/2012 | Mishima et al. |
| 8,116,034 B2 | 2/2012 | Komura |
| 8,116,176 B2 | 2/2012 | Kato |
| 8,159,769 B2 | 4/2012 | Batra et al. |
| 8,194,510 B2 | 6/2012 | Sasaki |
| 8,194,511 B2 | 6/2012 | Sasaki |
| 8,213,272 B2 | 7/2012 | Takayama |
| 8,223,597 B2 | 7/2012 | Komura |
| 8,248,891 B2 | 8/2012 | Lee |
| 8,284,521 B2 | 10/2012 | Ohtsu |
| 8,284,635 B2 | 10/2012 | Matsumoto |
| 8,289,650 B2 | 10/2012 | Seigler |
| 8,320,220 B1 | 11/2012 | Yuan |
| 8,325,567 B2 | 12/2012 | Miyauchi |
| 8,331,205 B2 | 12/2012 | Seigler |
| 8,339,740 B2 | 12/2012 | Zou |
| 8,351,151 B2 | 1/2013 | Katine |
| 8,385,159 B2 | 2/2013 | Gao |
| 8,391,105 B2 | 3/2013 | Shimazawa |
| 8,391,106 B2 | 3/2013 | Shimazawa et al. |
| 8,400,902 B2 | 3/2013 | Huang |
| 8,405,056 B2 | 3/2013 | Amaldi |
| 8,405,932 B2 | 3/2013 | Seigler |
| 8,416,530 B2 | 4/2013 | Gao et al. |
| 8,416,647 B1 | 4/2013 | Zhao et al. |
| 8,427,925 B2 | 4/2013 | Zhao |
| 8,451,555 B2 | 5/2013 | Seigler |
| 8,451,705 B2 | 5/2013 | Peng et al. |
| 8,477,454 B2 | 7/2013 | Zou |
| 8,488,419 B1 | 7/2013 | Jin et al. |
| 8,514,673 B1 | 8/2013 | Zhao et al. |
| 8,553,505 B2 | 10/2013 | Rawat |
| 8,670,215 B2 | 3/2014 | Zou |
| 8,675,457 B1 | 3/2014 | Hirata |
| 8,711,662 B2 | 4/2014 | Lee |
| 8,733,959 B2 | 5/2014 | Moriya et al. |
| 8,773,959 B2 | 7/2014 | Moriya |
| 8,830,800 B1 | 9/2014 | Pitcher et al. |
| 8,917,581 B1 | 12/2014 | Mallary |
| 8,934,198 B2 | 1/2015 | Zou |
| 8,958,168 B1 | 2/2015 | Yuan |
| 9,019,803 B1 | 4/2015 | Jin et al. |
| 9,058,824 B2 | 6/2015 | Cheng |
| 9,099,129 B2 | 8/2015 | Nishijima et al. |
| 9,129,620 B2 | 9/2015 | Cheng et al. |
| 9,245,573 B2 | 1/2016 | Sahoo |
| 9,281,002 B2 | 3/2016 | Brons et al. |
| 9,502,070 B2 | 11/2016 | Cheng |
| 9,570,098 B2 | 2/2017 | Jayashankar et al. |
| 9,620,150 B2 | 4/2017 | Cheng et al. |
| 9,792,931 B2 | 10/2017 | Sahoo et al. |
| 9,799,353 B2 | 10/2017 | Cheng et al. |
| 9,822,444 B2 | 11/2017 | Zhao |
| 9,899,566 B2 | 2/2018 | Amstatt |
| 10,014,011 B2 | 7/2018 | Sahoo et al. |
| 10,190,210 B2 | 1/2019 | Zhao et al. |
| 10,482,914 B2 | 11/2019 | Cheng et al. |
| 10,519,540 B2 | 12/2019 | Zhao et al. |
| 2005/0012052 A1 | 1/2005 | Platzgummer |
| 2005/0190496 A1 | 9/2005 | Hamann |
| 2006/0238133 A1 | 10/2006 | Horsky |
| 2007/0069383 A1 | 3/2007 | Suzuki |
| 2008/0230724 A1 | 9/2008 | Low |
| 2009/0073858 A1 | 3/2009 | Seigler |
| 2009/0130365 A1 | 5/2009 | Kojima |
| 2009/0225636 A1 | 9/2009 | Hirano |
| 2010/0103553 A1 | 4/2010 | Shimazawa |
| 2010/0123965 A1 | 5/2010 | Lee |
| 2010/0123967 A1 | 5/2010 | Batra |
| 2010/0123968 A1 | 5/2010 | Yoshida |
| 2010/0128579 A1 | 5/2010 | Seigler |
| 2010/0149930 A1 | 6/2010 | Komura |
| 2010/0157746 A1 | 6/2010 | Hongo |
| 2010/0190036 A1 | 7/2010 | Komvopoulos |
| 2010/0214685 A1 | 8/2010 | Seigler |
| 2010/0309581 A1 | 12/2010 | Wu |
| 2010/0315736 A1 | 12/2010 | Takayama |
| 2010/0320403 A1 | 12/2010 | Amaldi |
| 2010/0329085 A1 | 12/2010 | Kawamori |
| 2011/0006214 A1 | 1/2011 | Bonig |
| 2011/0026161 A1 | 2/2011 | Ikeda |
| 2011/0038236 A1 | 2/2011 | Mizuno |
| 2011/0058272 A1 | 3/2011 | Miyauchi |
| 2011/0090588 A1* | 4/2011 | Gao ............... G11B 5/314 360/59 |
| 2011/0096431 A1 | 4/2011 | Hellwig |
| 2011/0122735 A1 | 5/2011 | Kato |
| 2011/0205863 A1* | 8/2011 | Zhao ............... B82Y 10/00 369/13.33 |
| 2012/0045662 A1 | 2/2012 | Zou |
| 2012/0105996 A1 | 5/2012 | Katine |
| 2012/0127839 A1 | 5/2012 | Rawat |
| 2012/0163139 A1* | 6/2012 | Vavra ............... G11B 5/314 369/13.33 |
| 2012/0213042 A1 | 8/2012 | Aoki |
| 2012/0201491 A1 | 9/2012 | Zhou |
| 2013/0107679 A1 | 5/2013 | Huang |
| 2013/0108212 A1 | 5/2013 | Peng |
| 2013/0161505 A1 | 6/2013 | Pitcher |
| 2013/0164453 A1 | 6/2013 | Pitcher |
| 2013/0164454 A1 | 6/2013 | Pitcher |
| 2013/0176839 A1 | 7/2013 | Peng |
| 2013/0235707 A1 | 9/2013 | Zhao |
| 2013/0279315 A1 | 10/2013 | Zhao |
| 2013/0286799 A1 | 10/2013 | Zhu |
| 2013/0286804 A1 | 10/2013 | Zhao |
| 2013/0288077 A1 | 10/2013 | Dhawan |
| 2014/0004384 A1 | 1/2014 | Zhao |
| 2014/0043948 A1 | 2/2014 | Hirata |
| 2014/0050057 A1 | 2/2014 | Zou |
| 2014/0050058 A1 | 2/2014 | Zou |
| 2014/0113160 A1 | 4/2014 | Pitcher |
| 2014/0177405 A1 | 6/2014 | Rejda |
| 2014/0254335 A1 | 9/2014 | Gage |
| 2014/0373642 A1 | 12/2014 | Wessel |
| 2014/0376341 A1 | 12/2014 | Wessel |
| 2014/0376349 A1 | 12/2014 | Cheng |
| 2014/0376350 A1 | 12/2014 | Cheng |
| 2014/0376351 A1 | 12/2014 | Cheng |
| 2014/0376352 A1 | 12/2014 | Cheng |
| 2015/0132503 A1 | 5/2015 | Kautzky |
| 2015/0162028 A1 | 6/2015 | Jayashankar |
| 2015/0162030 A1 | 6/2015 | Jayashankar |
| 2015/0179194 A1 | 6/2015 | Cheng |
| 2015/0340052 A1 | 11/2015 | Sankar |
| 2016/0133277 A1 | 5/2016 | Cheng |

(56) References Cited

U.S. PATENT DOCUMENTS

| | | |
|---|---|---|
| 2016/0133279 A1 | 5/2016 | Zhao |
| 2016/0275972 A1 | 9/2016 | Zhao et al. |
| 2017/0263276 A1 | 9/2017 | Sankar |
| 2018/0090159 A1 | 3/2018 | Zhao et al. |
| 2018/0366153 A1 | 12/2018 | Cheng et al. |

FOREIGN PATENT DOCUMENTS

| | | |
|---|---|---|
| EP | 0942072 | 9/1999 |
| EP | 1328027 | 7/2003 |
| EP | 2106678 | 10/2009 |
| JP | 2011/198450 | 10/2011 |
| JP | 2011/1238991 | 12/2011 |
| TW | 200929183 | 7/2009 |
| WO | WO 2013/163195 | 10/2013 |
| WO | WO 2013/163470 | 10/2013 |

OTHER PUBLICATIONS

Al-Bayati et al., Junction Profiles of Sub keV Ion Implantation for Deep Sub-Quarter Micron Devices, *IEEE*, 2000, pp. 87-90.

Angel et al., "Enhanced Low Energy Drift-Mode Beam Currents in a High Current Ion Implanter," *IEEE*, 1999, pp. 219-222.

Bannuru et al., "The Electrical and Mechanical Properties of Au—V and Au—V2O5 Thin Films for Wear-Resistant RF MEMS Switches", *Journal of Applied Physics*, 103, (2008), pp. 083522-1-083522-6.

Challener, et al., "Heat-Assisted Magnetic Recording by a Near-Field Transducer with Efficient Optical Energy Transfer," *Journal of Applied Physics*, Mar. 22, 2009.

Druz et al., "Diamond-Like Carbon Films Deposited Using a Broad, Uniform Ion Beam from an RF Inductively Coupled CH4-Plasma Source", Diamond and Related Materials, vol. 7, No. 7, Jul. 1998, pp. 965-972.

Liu et al., "Influence of the Incident Angle of Energetic Carbon Ions on the Properties of Tetrahedral Amorphous Carbon (ta-C) films", Journal of Vacuum Science and Technology, vol. 21, No. 5, Jul. 25, 2003, pp. 1665-1670.

Metallization: "Metallization"; chapter 5, In: Kris v. Srikrishnan and Geraldine C. Schwartz: "Handbook of Semiconductor Interconnection Technology, Second Edition", 2006, CRC Press, Boca Raton, FL, USA, XP002711255, ISBN:978-1-4200-1765-6, pp. 311-382, Section 5.4.1.2 Adhesion; p. 320.

PCT International Search Report and Written Opinion for PCT/US2015/059671 dated Apr. 29, 2016 (12 pages).

PCT/US2013/038120 Search Report and Written Opinion dated Jul. 19, 2013 (8 pages).

Piazza et al., "Large Area Deposition of Hydrogenated Amorphous Carbon Films for Optical Storage Disks", Diamond and Related Materials, vol. 13, No. 4-8, Apr. 2004, pp. 1505-1510.

Robertson, J., "Diamond-Like Amorphous Carbon," Materials Science and Engineering R 37, 2002, pp. 129-281.

Satoh et al., "Evaluation of Adhesion Materials for Gold Line-and-Space Surface Plasmon Antenna on SO1-MOS Photodiode", Silicon Nanoelectronics Workshop (SNW), 2010, IEEE, Piscataway, NJ, USA, Jun. 13, 2010, pp. 1-2.

Vogt, K.W. et al., "Characterization of Thin Titanium Oxide Adhesion Layers on Gold Resistivity, Morphology, and Composition", Surface Science, North-Holland, Amsterdam, NL, vol. 301, No. 1-3, Jan. 10, 1994, pp. 203-213.

Weller et al.,"A HAMR Medica Technology Roadmap to an Areal Density of 4 tb/in$^2$,", *IEEE Transactions on Magnetics*, vol. 50, No. 1, Jan. 2014.

Williams, et al., "Strengthening Gold Films with Zirconia Nanoparticles for MEMS Electrical Contacts", ScienceDirect, Acta Materialia 56, (2008), pp. 1813-1819.

Office Action from U.S. Appl. No. 15/357,333 dated Jul. 10, 2020, 17 pages.

File History for U.S. Appl. No. 14/313,651.
File History for U.S. Appl. No. 14/313,717.
File History for U.S. Appl. No. 14/561,825.
File History for U.S. Appl. No. 14/938,018.
File History for U.S. Appl. No. 15/357,333.
File History for U.S. Appl. No. 15/817,503.
File History for U.S. Appl. No. 15/952,506.
File History for U.S. Appl. No. 16/260,925.
File History for U.S. Appl. No. 16/688,656.
File History for U.S. Appl. No. 16/726,512.

\* cited by examiner

| Ion Energy | dE/dx Elec. | dE/dx Nuclear | Projected Range | Longitudinal Straggling | Lateral Straggling |
|---|---|---|---|---|---|
| 10.00 keV | 9.782E-02 | 1.778E+00 | 28 A | 21 A | 15 A |
| 11.00 keV | 1.026E-01 | 1.854E+00 | 30 A | 21 A | 15 A |
| 12.00 keV | 1.072E-01 | 1.926E+00 | 31 A | 22 A | 16 A |
| 13.00 keV | 1.115E-01 | 1.993E+00 | 32 A | 23 A | 16 A |
| 14.00 keV | 1.157E-01 | 2.057E+00 | 34 A | 24 A | 17 A |
| 15.00 keV | 1.198E-01 | 2.118E+00 | 35 A | 25 A | 18 A |
| 16.00 keV | 1.237E-01 | 2.175E+00 | 36 A | 25 A | 18 A |
| 17.00 keV | 1.275E-01 | 2.230E+00 | 37 A | 26 A | 19 A |
| 18.00 keV | 1.312E-01 | 2.282E+00 | 38 A | 27 A | 19 A |
| 20.00 keV | 1.383E-01 | 2.380E+00 | 41 A | 28 A | 20 A |
| 22.50 keV | 1.467E-01 | 2.492E+00 | 43 A | 30 A | 21 A |
| 25.00 keV | 1.547E-01 | 2.594E+00 | 46 A | 31 A | 22 A |
| 27.50 keV | 1.622E-01 | 2.688E+00 | 49 A | 33 A | 23 A |
| 30.00 keV | 1.694E-01 | 2.775E+00 | 51 A | 34 A | 25 A |
| 32.50 keV | 1.763E-01 | 2.855E+00 | 54 A | 36 A | 26 A |
| 35.00 keV | 1.830E-01 | 2.931E+00 | 56 A | 37 A | 27 A |
| 37.50 keV | 1.894E-01 | 3.001E+00 | 58 A | 38 A | 27 A |
| 40.00 keV | 1.956E-01 | 3.068E+00 | 61 A | 40 A | 28 A |
| 45.00 keV | 2.075E-01 | 3.190E+00 | 65 A | 42 A | 30 A |
| 50.00 keV | 2.187E-01 | 3.300E+00 | 69 A | 45 A | 32 A |
| 55.00 keV | 2.294E-01 | 3.400E+00 | 74 A | 47 A | 34 A |
| 60.00 keV | 2.396E-01 | 3.491E+00 | 78 A | 49 A | 35 A |
| 65.00 keV | 2.494E-01 | 3.575E+00 | 82 A | 51 A | 37 A |
| 70.00 keV | 2.588E-01 | 3.652E+00 | 86 A | 53 A | 38 A |
| 80.00 keV | 2.767E-01 | 3.791E+00 | 93 A | 57 A | 41 A |
| 90.00 keV | 2.934E-01 | 3.911E+00 | 101 A | 61 A | 44 A |
| 100.00 keV | 3.093E-01 | 4.018E+00 | 108 A | 65 A | 47 A |
| 110.00 keV | 3.244E-01 | 4.113E+00 | 115 A | 69 A | 50 A |
| 120.00 keV | 3.388E-01 | 4.198E+00 | 123 A | 73 A | 53 A |
| 130.00 keV | 3.527E-01 | 4.275E+00 | 130 A | 76 A | 55 A |
| 140.00 keV | 3.660E-01 | 4.344E+00 | 136 A | 80 A | 58 A |
| 150.00 keV | 3.788E-01 | 4.408E+00 | 143 A | 83 A | 60 A |
| 160.00 keV | 3.913E-01 | 4.466E+00 | 150 A | 87 A | 63 A |
| 170.00 keV | 4.033E-01 | 4.519E+00 | 157 A | 90 A | 65 A |
| 180.00 keV | 4.150E-01 | 4.568E+00 | 163 A | 93 A | 67 A |
| 200.00 keV | 4.374E-01 | 4.656E+00 | 176 A | 100 A | 72 A |
| 225.00 keV | 4.640E-01 | 4.747E+00 | 192 A | 108 A | 78 A |
| 250.00 keV | 4.891E-01 | 4.824E+00 | 208 A | 115 A | 83 A |
| 275.00 keV | 5.129E-01 | 4.889E+00 | 224 A | 123 A | 89 A |
| 300.00 keV | 5.358E-01 | 4.944E+00 | 239 A | 130 A | 94 A |
| 325.00 keV | 5.576E-01 | 4.991E+00 | 255 A | 138 A | 99 A |
| 350.00 keV | 5.787E-01 | 5.030E+00 | 270 A | 145 A | 104 A |
| 375.00 keV | 5.990E-01 | 5.064E+00 | 286 A | 152 A | 109 A |
| 400.00 keV | 6.234E-01 | 5.093E+00 | 301 A | 159 A | 114 A |
| 450.00 keV | 6.965E-01 | 5.138E+00 | 331 A | 173 A | 124 A |
| 500.00 keV | 7.609E-01 | 5.170E+00 | 361 A | 186 A | 134 A |
| 550.00 keV | 8.166E-01 | 5.191E+00 | 390 A | 200 A | 144 A |
| 600.00 keV | 8.645E-01 | 5.204E+00 | 420 A | 213 A | 153 A |

FIG. 10

METHODS OF FORMING NEAR FIELD TRANSDUCERS AND NEAR FIELD TRANSDUCERS FORMED THEREBY

PRIORITY

This application is a continuation of U.S. patent application Ser. No. 14/561,825, filed Dec. 5, 2014, now U.S. Pat. No. 9,697,856, and which claims priority to U.S. Provisional Application No. 61/912,796 entitled "NFT FILM AND DENSIFICATION METHOD" filed on Dec. 6, 2013, the disclosures of which are is incorporated herein by reference thereto.

SUMMARY

A method of forming a near field transducer (NFT), the method including the steps of depositing a primary material; and implanting a secondary element, wherein both the primary material and the secondary element are chosen such that the primary material is densified via implantation of the secondary element.

Also disclosed is method of forming a near field transducer (NFT), the method including the steps of: depositing a primary material; implanting a secondary element into the primary material; and forming at least part of a near field transducer (NFT) from the implanted primary material, wherein the primary material and the secondary element are the same.

Also disclosed is a method of forming a near field transducer (NFT), the method including the steps of: depositing a primary material; implanting a secondary element, wherein both the primary material and the secondary element are chosen such that the primary material is densified via implantation of the secondary element; and defining at least part of the NFT from the primary material using at least one patterning step.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Heat assisted magnetic recording (referred to through as HAMR) utilizes radiation, for example from a laser, to heat media to a temperature above its curie temperature, enabling magnetic recording. In order to deliver the radiation, e.g., a laser beam, to a small area (on the order of 20 to 50 nm for example) of the medium, a NFT is utilized. During a magnetic recording operation, the NFT absorbs energy from a laser and focuses it to a very small area; this can cause the temperature of the NFT to increase. The temperature of the NFT can be elevated up to about 400° C. or more.

The very high temperatures that the NFT reaches during operation can lead to diffusion of the material of the NFT (for example gold) from the peg and towards the disk, which is also referred to as peg recession. One factor that may play a role in peg recession may be lack of full film density. During use, the HAMR head is exposed to elevated temperatures, a porous film, under such conditions, will likely tend to minimize its surface energy and conserve volume by pore condensation, which manifests as NFT peg recession. NFT pegs, discs, and heat sinks made using electro or sputter deposition often are not fully dense. This can be due to the inertness and intrinsically poor wettability of materials, such as gold, that are deposited on substrates (e.g., dielectric substrates such as $SiO_2$ or $Al_2O_3$). The problem can be exacerbated in situations where the film thickness and device geometries are scaled down to dimensions in the nanometers (e.g., sub 100 nm dimensions). Studies have shown that gold deposited on a variety of substrates exhibits only about 50 to 60% surface coverage for the first few monolayers on the substrate with the density increasing to about 85% of the theoretical density after about 10 monolayers are formed.

Film nanoporosity also negates potential beneficial effects of other alloying elements on the mechanical properties of the material, especially when an alloying element concentration is below a few percent, as is often the case in NFTs that are made of alloys. A lack of full film density may also cause degradation in optical/plasmonic properties of the NFT film due to small voids (e.g., nanovoids) acting as scattering centers. A lack of control of the concentration of such small voids may also lead to process variation in film quality, with implications in variations in film hardness, and mechanical and optical properties and therefore device performance. Because of all the possible detrimental effects of porous films, there is a need for a process that more repeatedly achieves a fully dense NFT film.

Figure 1:
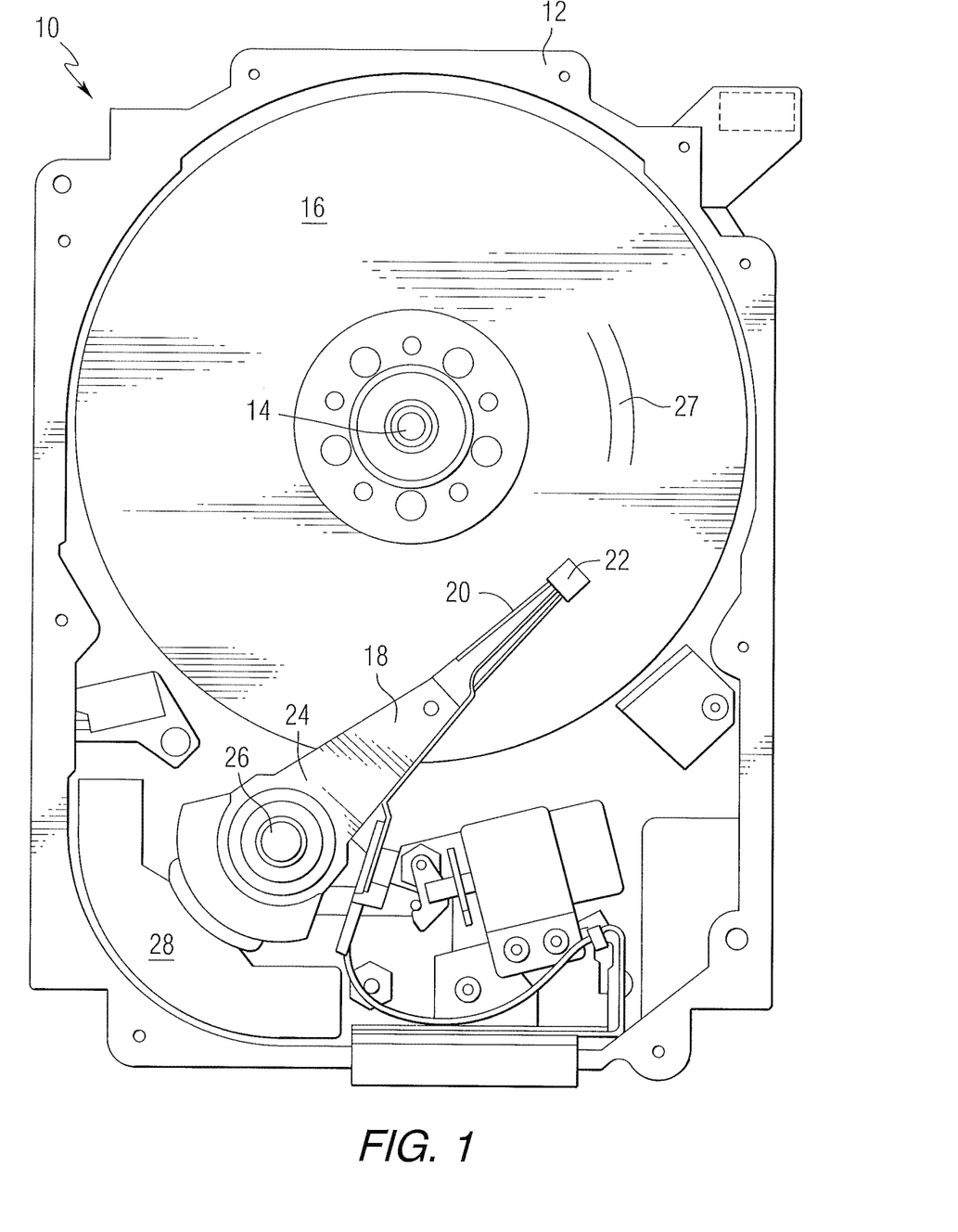
FIG. 1 is a pictorial representation of a data storage device in the form of a disc drive that can include a recording head constructed in accordance with an aspect of this disclosure.

Disclosed herein are methods of forming NFTs, NFTs formed thereby, and devices that include such NFTs. FIG. 1 is a pictorial representation of a data storage device in the form of a disc drive 10 that can utilize disclosed NFTs. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector or track 27 of the disc 16. The actuator motor 28 is regulated by a controller, which is not shown in this view and is well-known in the art. The storage media may include, for example, continuous media or bit patterned media.

For heat assisted magnetic recording (HAMR), electromagnetic radiation, for example, visible, infrared or ultraviolet light is directed onto a surface of the data storage media to raise the temperature of a localized area of the media to facilitate switching of the magnetization of the area. Recent designs of HAMR recording heads include a thin film waveguide on a slider to guide light toward the storage media and a near field transducer to focus the light to a spot size smaller than the diffraction limit. While FIG. 1 shows a disc drive, disclosed NFTs can be utilized in other devices that include a near field transducer.

Figure 2:
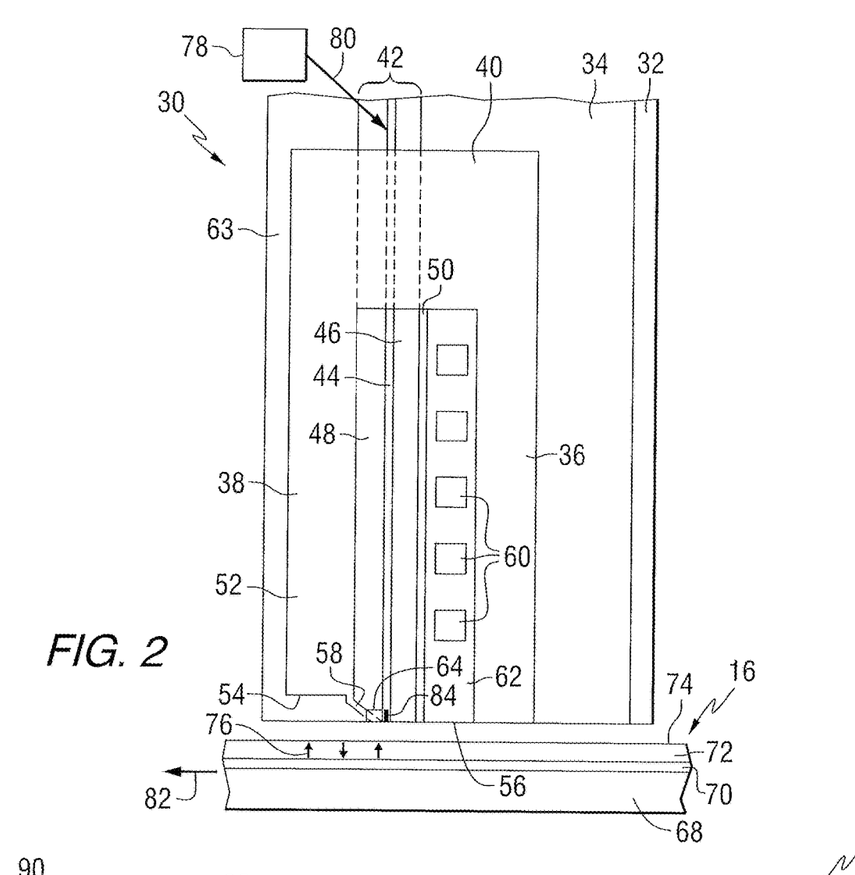
FIG. 2 is a side elevation view of a recording head constructed in accordance with an aspect of the invention.

FIG. 2 is a side elevation view of a recording head that may include a disclosed NFT; the recording head is positioned near a storage media. The recording head 30 includes a substrate 32, a base coat 34 on the substrate, a bottom pole 36 on the base coat, and a top pole 38 that is magnetically coupled to the bottom pole through a yoke or pedestal 40. A waveguide 42 is positioned between the top and bottom poles. The waveguide includes a core layer 44 and cladding layers 46 and 48 on opposite sides of the core layer. A mirror 50 is positioned adjacent to one of the cladding layers. The top pole is a two-piece pole that includes a first portion, or pole body 52, having a first end 54 that is spaced from the air bearing surface 56, and a second portion, or sloped pole piece 58, extending from the first portion and tilted in a direction toward the bottom pole. The second portion is structured to include an end adjacent to the air bearing surface 56 of the recording head, with the end being closer to the waveguide than the first portion of the top pole. A planar coil 60 also extends between the top and bottom poles and around the pedestal. In this example, the top pole serves as a write pole and the bottom pole serves as a return pole.

An insulating material 62 separates the coil turns. In one example, the substrate can be AlTiC, the core layer can be $Ta_2O_5$, and the cladding layers (and other insulating layers) can be $Al_2O_3$. A top layer of insulating material 63 can be formed on the top pole. A heat sink 64 is positioned adjacent to the sloped pole piece 58. The heat sink can be comprised of a non-magnetic material, such as for example Au.

As illustrated in FIG. 2, the recording head 30 includes a structure for heating the magnetic storage media 16 proximate to where the write pole 58 applies the magnetic write field H to the storage media 16. In this example, the media 16 includes a substrate 68, a heat sink layer 70, a magnetic recording layer 72, and a protective layer 74. However, other types of media, such as bit patterned media can be used. A magnetic field H produced by current in the coil 60 is used to control the direction of magnetization of bits 76 in the recording layer of the media.

The storage media 16 is positioned adjacent to or under the recording head 30. The waveguide 42 conducts light from a source 78 of electromagnetic radiation, which may be, for example, ultraviolet, infrared, or visible light. The source may be, for example, a laser diode, or other suitable laser light source for directing a light beam 80 toward the waveguide 42. Specific exemplary types of light sources 78 can include, for example laser diodes, light emitting diodes (LEDs), edge emitting laser diodes (EELs), vertical cavity surface emitting lasers (VCSELs), and surface emitting diodes. In some embodiments, the light source can produce energy having a wavelength of 830 nm, for example. Various techniques that are known for coupling the light beam 80 into the waveguide 42 may be used. Once the light beam 80 is coupled into the waveguide 42, the light propagates through the waveguide 42 toward a truncated end of the waveguide 42 that is formed adjacent the air bearing surface (ABS) of the recording head 30. Light exits the end of the waveguide and heats a portion of the media, as the media moves relative to the recording head as shown by arrow 82. A near-field transducer (NFT) 84 is positioned in or adjacent to the waveguide and at or near the air bearing surface. The heat sink material may be chosen such that it does not interfere with the resonance of the NFT.

Although the example of FIG. 2 shows a perpendicular magnetic recording head and a perpendicular magnetic storage media, it will be appreciated that the disclosure may also be used in conjunction with other types of recording heads and/or storage media, even those where it is not necessary to concentrate light to a small spot (e.g., recording heads other than HAMR heads).

Figure 3:
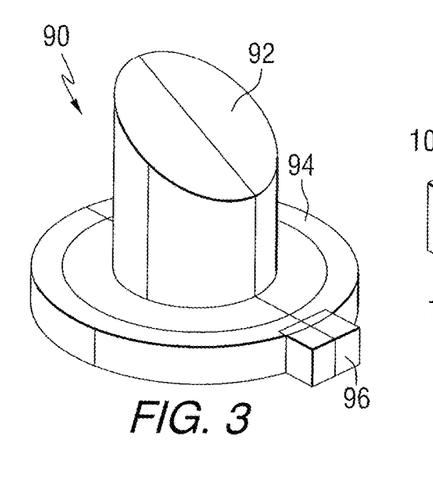
FIG. 3 is a schematic representation of a near field transducer.

FIG. 3 is a schematic view of a lollypop NFT 90 in combination with a heat sink 92. The NFT includes a disk shaped portion 94 and a peg 96 extending from the disk shaped portion. The heat sink 92 can be positioned between the disk shaped portion and the sloped portion of the top pole in FIG. 2. When mounted in a recording head, the peg may be exposed at the ABS and thus can be subjected to mechanical wearing.

Figure 4:
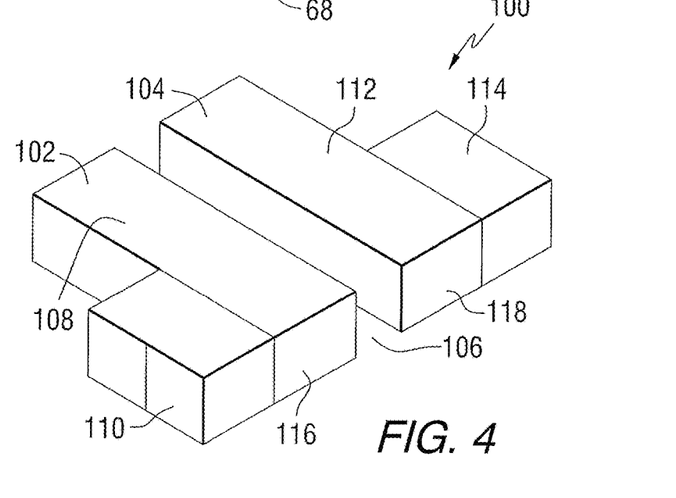
FIG. 4 is a schematic representation of another near field transducer.

FIG. 4 is a schematic view of a coupled nanorod (CNR) NFT 100. This NFT includes two nanorods 102 and 104 separated by a gap 106. Nanorod 102 includes a first portion 108 and a second portion 110. Nanorod 104 includes a first portion 112 and a second portion 114. When mounted in a recording head, the ends 116 and 118 of the nanorods may be exposed at the ABS and thus be subject to mechanical wearing. FIGS. 3 and 4 show example NFTs. However, the disclosure is not limited to any particular type of NFT. The methods described below may be used to fabricated various NFT configurations.

Disclosed herein are methods of forming NFTs that include a primary material and at least one secondary element. Primary materials may include plasmonic materials, for example, gold (Au), silver (Ag), copper (Cu), aluminum (Al), or combinations thereof. In some embodiments, the primary material may include Au for example.

NFTs disclosed herein also include a secondary element. In the disclosed embodiments, the secondary element is one that is considered a heavy element. Use of a heavy element as a secondary element or an alloying element with a primary material may produce films and resulting NFTs therefrom that are denser than they would be without the inclusion of the heavy element. The implanted secondary, heavy, element may have sufficient mass such that they compact the lattice of the primary material film by repeated heavy bombardment. As a result, the primary material film becomes progressively densified. A variety of ions can be chosen as an ion source that could densify a film of the primary material. In some embodiments, the denser the secondary element, the more efficient is the densification. In some embodiments the secondary element can be one that also advantageously modifies the optical, electronic, or mechanical properties of the primary material film.

In some embodiments, a secondary element can include materials that have an atomic mass greater than 40 atomic mass units (amu), in some embodiments greater than 80 amu, in some embodiments greater than 84 amu, in some embodiments greater than 130 amu, and in some embodiments greater than 133 amu. In some embodiments, a secondary element can include materials that have an atomic mass greater than 23 amu. In some embodiments, a secondary element can include materials that have an atomic mass greater than 7 amu.

In some embodiments, a secondary element can be chosen based at least in part on the primary material. For example, in some embodiments, a secondary element has an atomic mass that is comparable to (e.g., within 10%, within 5%, or within 2%) the atomic mass of the primary material it is being implanted into. In some embodiments, a secondary element has an atomic mass that is up to 20% higher than the atomic mass of the primary material that it is being implanted into.

Implantation of higher atomic weight elements can lead to more efficient film compaction at lower fluences, and may therefore be more efficient film densifiers at lower concentrations. Because they need to be used at lower amounts, they can therefore be utilized for film densification with minimal impact to the plasmonic properties. Self implantation of, for example, an Au NFT film with Au ion implants, an Ag film with Ag ion implants, an Al film with Al implants, Cu film with Cu implants, or a Rh films with Rh implants, may allow the plasmonic properties and material purity of the NFT and/or heat sink to not be impacted by the ion implant, since the material being used to densify the film is the same atom type as the material in the film.

Another advantage of disclosed methods may be that any lattice damage occurring during the densification process can be at least partially reversed by thermal annealing techniques which are known in the art. Therefore, such self implantations may provide significant benefits. Alternatively, the secondary element can form an alloy having limited solid solubility in the primary material. As another alternative, the secondary element can have negligible solubility in the primary element. Alternatively, the secondary element can form a compound phase with the primary material after subsequent annealing.

The energy that the secondary element is implanted at (also referred to as the energy of implantation) can be selected such that the implanted secondary element can be placed substantially in the center of the film thickness to be densified. In other words, the implant energy is chosen so as to center "Rp", the range of the ion in the center of the film. The tightness of the ion range is dependent on the atomic weight of the implanted ion. Heavier elements provide tighter confinement and better control. This may be especially important when implanting into primary materials disposed on top of sensitive optical layers which could degrade rapidly with the introduction of stray dopants from the implantation process. For beam implant systems, the thickness profile of the secondary element, and hence the extent of the densification zone, is Gaussian. The drop-off and the skew in the implant profile can be controlled by varying the incidence angle of the implanted ion. The dose required for the densification can be chosen so as to improve the density of the film. The optimal dose for the densification is determined experimentally or by simulations. Experimental determination of the film density is done using methods known in the art such as Rutherford Backscatter Spectrometry. The densification dose may indirectly impact the concentration of the secondary element in the film of the primary material.

The concentration of the secondary element can be varied from several 10s of ppm to several atomic percent. The concentration can be dictated, at least in part, by the dose of the secondary element necessary in order to provide densification of the primary material. In some embodiments, the secondary element can have a concentration that is not less than 10 ppm (or 0.001 atomic percent, at %), or in some embodiments not less than 100 ppm (0.01 at %). In some embodiments, the secondary element can have a concentration that is not greater than 10 at %, or in some embodiments not greater than 5 at %. The concentration of the secondary element can be controlled (e.g., metered in real time) using electrical methods, for example. Because control can be accomplished using electrical control, precise and repeatable control should be relatively easy to obtain.

In some embodiments, the secondary element can be the same as the primary material, and such methods can be referred to as self implantation. For example a gold film could be implanted with gold as a secondary element. Such self implantation can serve to improve the film density. The knock-in of the Au atoms (for example) into the already present gold lattice for instance may serve to densify the gold by transferring momentum from the secondary element being implanted into the surface. This can be considered to be analogous to shot peening, where a blast of dense steel beads on a metallic surface compacts the surface. Likewise, the momentum from the implanted ions can annihilate the voids that may be present and, in the case of self implantation, fill them with the same material. Self implantation may have the advantage that virtually unlimited doses of secondary element can be applied without concern for the optical penalty of the secondary element material to the NFT. In the same fashion, other NFT materials such as Ag, Cu, Al, Rh, etc. can also be densified and modified by self implantation with the appropriate species.

Figure 5:
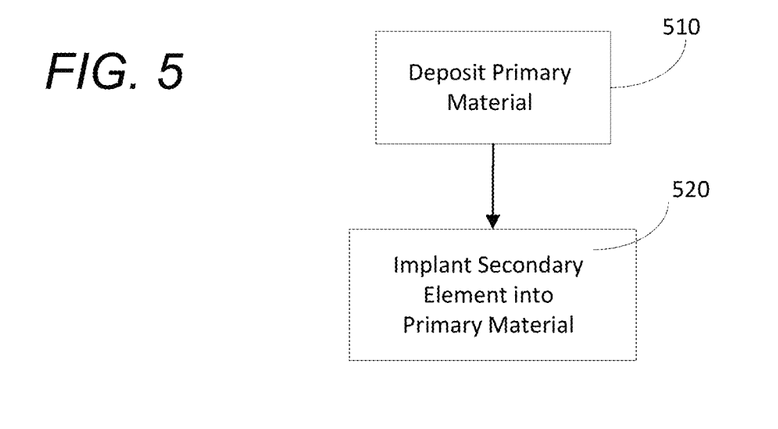
FIG. 5 is a flowchart depicting an illustrative disclosed method.

Disclosed herein are methods of forming NFTs. FIG. 5 is a flowchart showing an illustrative method. The depicted method includes steps 510, depositing a primary material, and step 520, implanting a secondary element into the primary material.

The first step, depositing a primary material can be carried out using many different processes such as those that would be known to one of skill in the art. Illustrative materials that can be utilized as primary materials can include, for example gold (Au), silver (Ag), aluminum (Al), copper (Cu), ruthenium (Ru), rhodium (Rh), iridium (Ir), or alloys thereof; thermally conductive oxides, and indium tin oxide (ITO). In some embodiments, illustrative NFT materials, which could be used as primary materials can also include those disclosed in U.S. Patent Publication No. 2013/0286799, U.S. Pat. No. 8,427,925, and U.S. patent application Ser. No. 13/923,925 entitled MAGNETIC DEVICES INCLUDING FILM STRUCTURES, filed on Jun. 21, 2013, and Ser. No. 14/062,651 entitled RECORDING HEADS INCLUDING NFT AND HEAT SINK, filed on Oct. 24, 2013, the disclosures of which are incorporated herein by reference thereto to the extent they do not conflict. The primary material can be deposited using any deposition methods including for example sputter deposition, and electrodeposition.

The next step is implantation of the secondary element into the primary material. In some embodiments specific secondary element implantation methods that can be utilized can include beam line implants, or plasma immersion implants for example. The ion beam used for implanting a secondary element can be from a beam line producing a pure or skewed Gaussian profile, or a plasma ion immersion system forming an error function secondary element profile.

Implantation of the secondary element can be carried out at elevated temperature or at cryogenic or cold temperature.

Any of the disclosed methods can be carried out on planar surfaces, on sloped or contoured surfaces, on surfaces with retrograde wall angles, or any combination thereof. Although formation of NFT elements are specifically contemplated and discussed herein, it will be understood by one of skill in the art that disclosed methods can also be utilized in the formation of heat sink elements, for example, as well.

In some embodiments, the secondary element could have a substantially constant concentration across the NFT (or NFT precursor) or could have a concentration that changes. The profile of the secondary elements through the thickness of the film could be Gaussian, or could be an error function secondary element distribution for example. In some embodiments, the secondary element could be implanted at the same energy throughout the primary material or could be implanted at different energies at different portions of the film. The energy of implantation can control, at least in part, the depth at which the secondary element is implanted in the film of the plasmonic material. The energy for the implantation could be a single energy, or it could be a combination of energies for example. In embodiments where more than one energy is utilized, the profiles of each could additively be used to shape and tailor the final profile (e.g., the depth profile) of the secondary element in the film.

In some embodiments, the fluence of the implanted secondary element can be considered. In some embodiments the fluence at which the secondary element can be implanted can be at least $1\times10^{13}$ ions/cm$^2$. In some embodiments, the fluence at which the secondary element can be implanted can be not greater than $1\times10^{15}$ ions/cm$^2$. In some embodiments the incidence energy of the secondary element being implanted can be at least 200 eV. In some embodiments the incidence energy of the secondary element being implanted can be at least 1 keV. In some embodiments the incidence energy of the secondary element being implanted can be not greater than 100 keV. In some embodiments the incidence energy of the secondary element being implanted can be not greater than 50 keV.

In addition to through thickness tailoring of the composition profile, the composition could alternatively (or in combination) be spatially varied across the breadth or expanse of the film (e.g., the wafer diameter). For example, the center of the wafer could have a first composition profile while the edge of the wafer could have a second and different composition profile. In some embodiments more than one secondary element could be implanted in a plasmonic material, each optionally having a chosen through thickness and across wafer composition profile. The sequence in which the secondary elements are implanted can be chosen such that the diffusivity and the crystallinity of the film can be advantageously affected.

In some embodiments, the ion beam can be directed at a normal angle (90 degree) to the wafer or sample surface, or it can be incident at an angle ranging anywhere from 1 degree to 90 degrees, relative to the wafer or sample surface. In some embodiments, the sample can be stationary during the implantation, or it can be rotated at a fixed or variable rate of speed during implanting.

Figure 9:
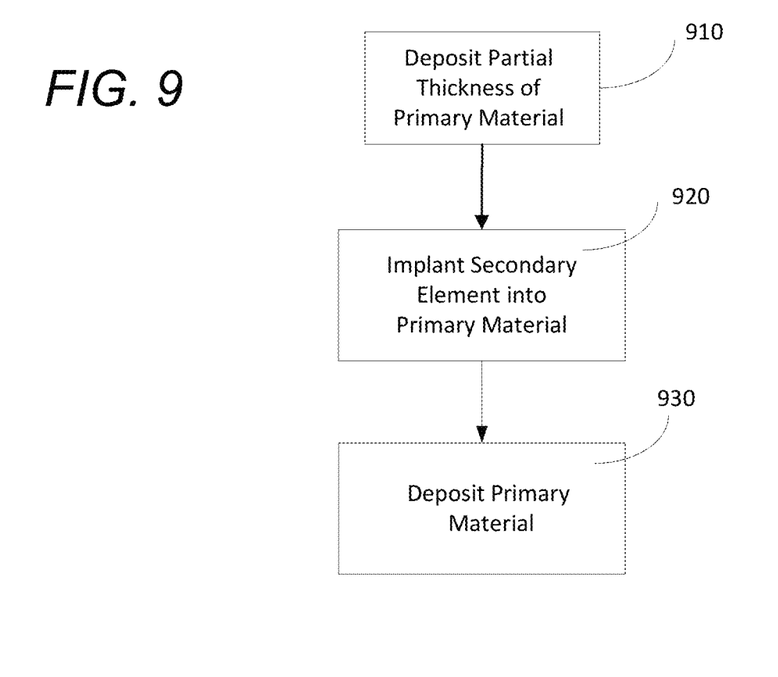
FIG. 9 is a flowchart depicting illustrative disclosed methods.

Some embodiments of disclosed methods can also include more than one step of depositing the primary material. FIG. 9 shows a method that includes a step 910 of depositing a partial thickness of the primary material. The particular thickness deposited in this step can depend on numerous considerations, but will be some thickness less than the final thickness desired for fabricating the NFT, heatsink, or both.

The next step, step 920 is implanting a secondary element into the primary material. Then, step 930 is depositing the primary material again. Such methods can be advantageous to compensate for a portion of the primary material that may have been lost due to sputtering effects, to allow densification to occur in a smaller thickness of primary material, or both. It should also be noted that numerous iterations of steps 920 and 930 could be carried out to build up thicker films where the bottom layers were densified before the layers above it were deposited.

In an alternate embodiment, the NFT film may be deposited to a thickness of between 5 and 20 nm, and in some embodiments between 8 and 15 nm. Subsequent to the deposition, the NFT sheet film can be densified using a heavy ion beam. For an Au plasmonic film, an ion beam of Au itself, which is implanted on the film at a dose of between $1\times10^{11}$ and $1\times10^{16}$ ions/cm$^2$ can be utilized. In some embodiments the dose can be between $1\times10^{12}$ and $5\times10^{15}$, at an energy of between 200 eV and 80 keV. In some embodiments, the dose can be in the range from 1 keV to 50 keV. In some embodiments, the dose can be in the range of 5 keV to 30 keV. A fraction of the film thickness may be lost due to sputtering effects which can be compensated during initial deposition. After the first implant step, a second deposition step of the plasmonic material can be carried out to bring the film thickness to the desired specification. An optional second ion implantation densification step may then be carried out in a similar fashion as mentioned before. Following this, the NFT film may be subjected to the rest of the NFT formation processes. Optional annealing and encapsulation steps can also be incorporated in such methods.

In some embodiments secondary elements may be incorporated into the primary material through secondary element implantation before the film or layer is formed into a NFT, or at a stage where the air bearing surface (ABS) of the NFT (and surrounding device) is being defined. Regardless of the timing of when the implantation is being done, the implantation can be done globally into the surface or it can be carried out in conjunction with a mask that allows only selected areas of the surface to be implanted.

Secondary element implantation being undertaken during ABS definition can be done at various stages, including for example at rough lap, at final lap, after the first layer of head overcoat has been deposited, or after the entire layer of head overcoat has been deposited. In some embodiments, a Gaussian secondary element profile can be implanted at rough lap, followed by a final lap, whose final thickness can be set to advantageously coincide with the 'Rp" of the implanted Gaussian distribution. In some embodiments, the ABS surface can be subject to plasma immersion ion implantation, with the error function like distribution of the secondary element leading away from the ABS.

In some embodiments, more than one secondary element, each with its own energy and dose profile can be implanted into the ABS rowbar, for example. Such implantation could be carried out to improve the performance of the NFT element, to advantageously modify the properties of the head overcoat, or both. The implantation can also be done to advantageously modify the corrosion resistance of the write pole material. Implantation carried out after the deposition of a partial or full head overcoat (which in such an embodiment would be the encapsulant material referred to in disclosed methods) may serve to "lock" the secondary element inside the active device structure (write pole or NFT), thereby serving to improve its efficacy.

Implantation at an ABS processing stage can also optionally be combined with sequential oxidation processes to form thin metal oxides for protection purposes, for example.

Disclosed methods can also include additional steps that may be included in disclosed methods at various points in disclosed sequences. The flowchart in FIG. 6 depicts two illustrative methods that include various optional steps being carried out at various points in the illustrated methods.

Figure 6:
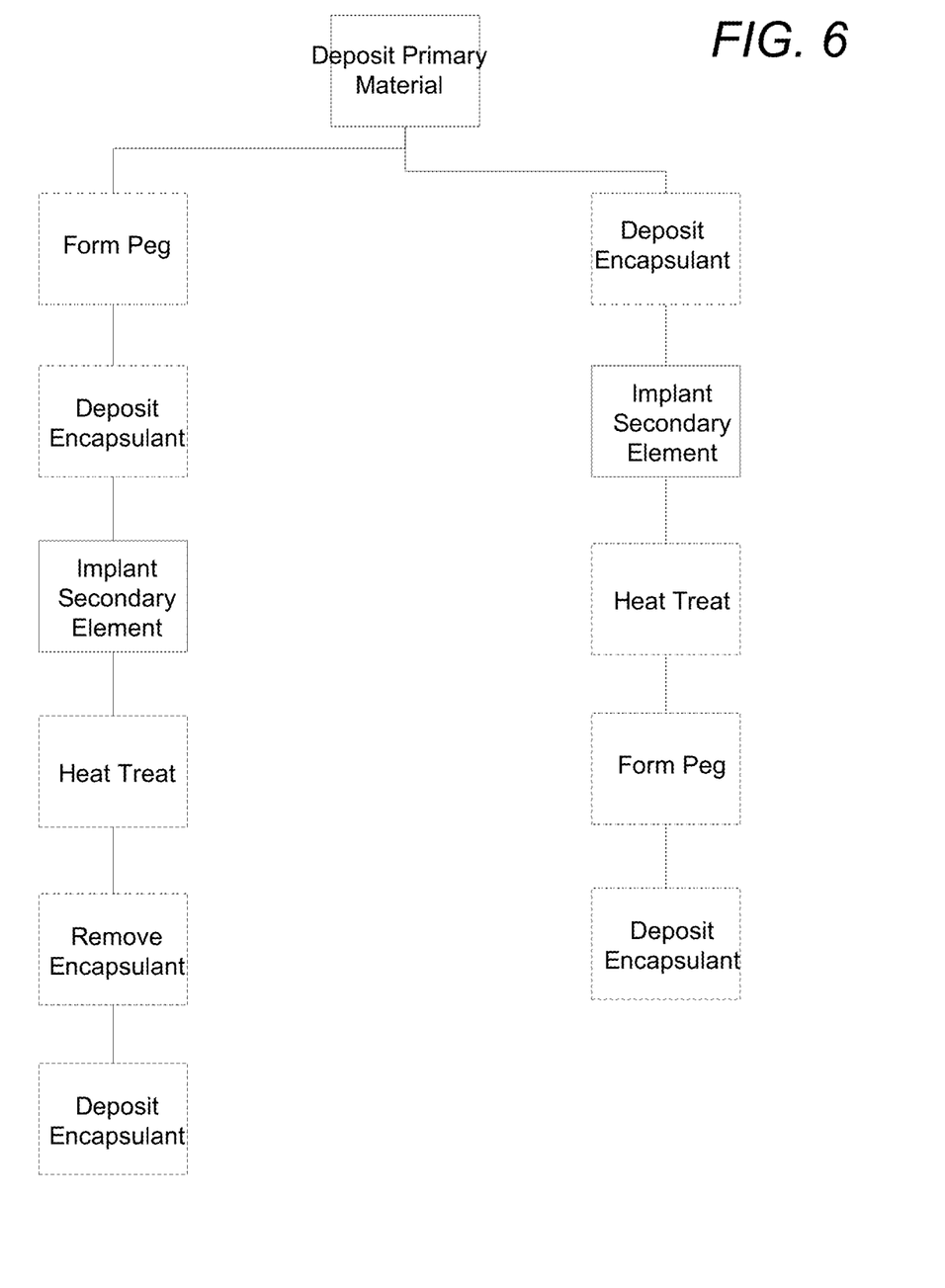
FIG. 6 is a flowchart depicting illustrative disclosed methods.

For example, as seen in the flowchart of FIG. 6, once the primary material is deposited, the primary material can optionally be formed into a peg. It should also be noted that such an optional step can be carried out after implantation of a secondary element as well. Formation of a peg can include a patterning step (or steps) and can also include various removal methods. The step of forming a peg from the primary material can include one or more than one step and can utilize known patterning processes including, for example photolithography, etching, etc. It should also be noted that primary material can be formed into a disc, a heat sink, or both as well as or instead of a peg. It should also be noted that primary material can be formed into other types (as opposed to a lollipop type that includes a peg and disc) of NFTs, as discussed above.

Another optional step that is seen in the flowchart of FIG. 6 is deposition of an encapsulant material. An encapsulant material, if utilized, may function to keep the secondary element from diffusing out of the primary material, and/or perhaps more of a concern, keep the secondary element from being affected by materials, e.g., gases, in the atmosphere surrounding it. The encapsulant material can include, for example dielectric materials for example. Details surrounding the use of encapsulant material in such methods can be found in United States Utility Application entitled "METHODS OF FORMING NEAR FIELD TRANSDUCERS AND NEAR FIELD TRANSDUCERS FORMED THEREBY" filed on the same day as the instant application, the disclosure of which is incorporated herein by reference thereto, to the extent it does not conflict.

Another optional step that is seen in the flowchart of FIG. 6 is a heat treatment step. In some embodiments, an optional thermal treatment could be used to shape the secondary element profile in the primary material for example. In some embodiments, multiple thermal treatments, multiple implantation steps, or combinations thereof can be carried out. Heat treatment step(s) may also serve to further densify the primary material once the secondary element has been implanted therein.

The flowchart in FIG. 6 also shows optional steps that include removing encapsulant and a second step of depositing encapsulant. In some embodiments, it may be advantageous to remove a portion of the encapsulant layer after implantation through it has taken place. It could be advantageous because there may be some secondary element atoms (or ions) in the encapsulant layer after implantation. The presence of such secondary element atoms can diminish desired functions and properties that the encapsulant layer has in the device once fully processed and formed. As such, removing some portion of the encapsulant layer and re-depositing the encapsulant material after implantation has been completed can be advantageous. In some embodiments, a step of removing a portion of the encapsulant material does not remove the entirety of the encapsulant. This can be advantageous because it allows the barrier to gas (e.g., oxygen which could react with the secondary element) to be present at all times.

Various other optional steps not specifically discussed herein can also be included, as would be aware to one of skill in the art to form a NFT, or a larger device that includes a NFT. NFTs, and larger devices including NFTs formed using disclosed methods are also disclosed herein.

While the present disclosure is not so limited, an appreciation of various aspects of the disclosure will be gained through a discussion of the examples provided below.

EXAMPLES

In an illustrative process, the NFT (or heat sink) film may be deposited to a thickness of between 5 and 20 nm, and in some embodiments between 8 and 15 nm. Subsequent to the deposition, the NFT sheet film can be densified using a heavy ion beam. For an illustrative Au film, the NFT Au film is deposited to a thickness of between 5 and 20 nm, and in some embodiments between 8 and 15 nm. Subsequent to the deposition, the NFT sheet film is densified using a heavy ion beam. For this illustrative Au plasmonic film, the ion beam itself is Au which is implanted on the film at a dose of between 1E11 and 1E16 ions/cm2 ($1 \times 10^{11}$ to about $1 \times 10^{16}$ ions/cm$^2$), in some embodiments a dose of between 1E12 and 5E15 ($1 \times 10^{12}$ to about $5 \times 10^{15}$) ions/cm$^2$; at an energy of between 200 eV and 80 keV, in some embodiments in the range of 1 keV to 50 keV, and in some embodiments in the range of 5 keV to 30 keV. A fraction of the film thickness may be lost due to sputtering effects which can be compensated during initial deposition. After the first implant step, a second deposition step of the plasmonic material is carried out to bring the film thickness to the desired specification. An optional second ion implantation densification step may then be carried out in a similar fashion as mentioned before. Following this, the NFT film may be subjected to the rest of the NFT formation processes. Optional annealing and encapsulation steps can also be incorporated in the flow. Tight confinement of the densified zone of the film can be achieved by having the incident ion beam strike the surface of the film at oblique angles, that is, angles that are between 0 and 90 degree to the film surface to be densified.

An illustrative process flow for carrying out a disclosed method can include the following: deposition of a primary material (e.g., a plasmonic material such as gold (Au), silver (Ag), copper (Cu), aluminum (Al), or a combination thereof) to form a primary material film or layer; definition of the peg of a NFT from the primary material film or layer using patterning methods such as photolithography for example; formation of the peg of a NFT using removal methods such as etching, etc.; definition of an implant area using a mask; and implantation of a secondary element(s) in the implant area of the primary material film. In some embodiments, an optional heat treatment step can be carried out after the step of implanting the secondary element(s).

Another illustrative process flow for carrying out a disclosed method can include the following: deposition of a primary material (e.g., a plasmonic material such as gold (Au), silver (Ag), copper (Cu), aluminum (Al), or a combination thereof) to form a primary material film or layer; implantation of a secondary element(s) in the primary material film to form a NFT layer; definition of the peg of a NFT from the NFT layer using patterning methods such as photolithography for example; formation of the peg of a NFT using removal methods such as etching, etc. In some embodiments, an optional step of deposition of a dielectric material on the primary material film or layer can be carried out before the secondary element(s) is implanted. In some embodiments, an optional heat treatment step can be carried out after the step of implanting the secondary element(s). In some embodiments, an optional step of removing at least part of the encapsulating dielectric material can be undertaken after implantation of the secondary element(s) (or optionally after the optional heat treatment). This can function to remove dielectric material that may have secondary element(s) implanted therein. If at least part of the encapsulating dielectric material was removed, another optional step may be added to redeposit some additional dielectric material (either the same dielectric material or a different dielectric material) once the peg is formed.

Another illustrative process flow for carrying out a disclosed method can include the following: deposition of a primary material (e.g., a plasmonic material such as gold (Au), silver (Ag), copper (Cu), aluminum (Al), or a combination thereof) to form a primary material film or layer on a substrate that can contain other layers, structures, or both; definition of a plurality of pegs of NFTs from the primary material layer using patterning methods such as photolithography for example; formation of the plurality of pegs of the NFTs using removal methods such as etching, etc.; formation of a plurality of entire magnetic recording heads containing the pegs of the NFTs on the substrate; slicing the substrate into rows, each row containing a plurality of magnetic recording heads; forming at least a portion of an overcoat on the row; and implantation of a secondary element(s) in at least the peg regions of the primary material film to form alloyed NFTs. In some embodiments, an additional portion of the overcoat layer can be deposited after implantation of the at least one secondary element. In some embodiments a portion of the overcoat material may be advantageously removed and re-deposited to control the integrity and film stress of the head overcoat.

Figure 7:
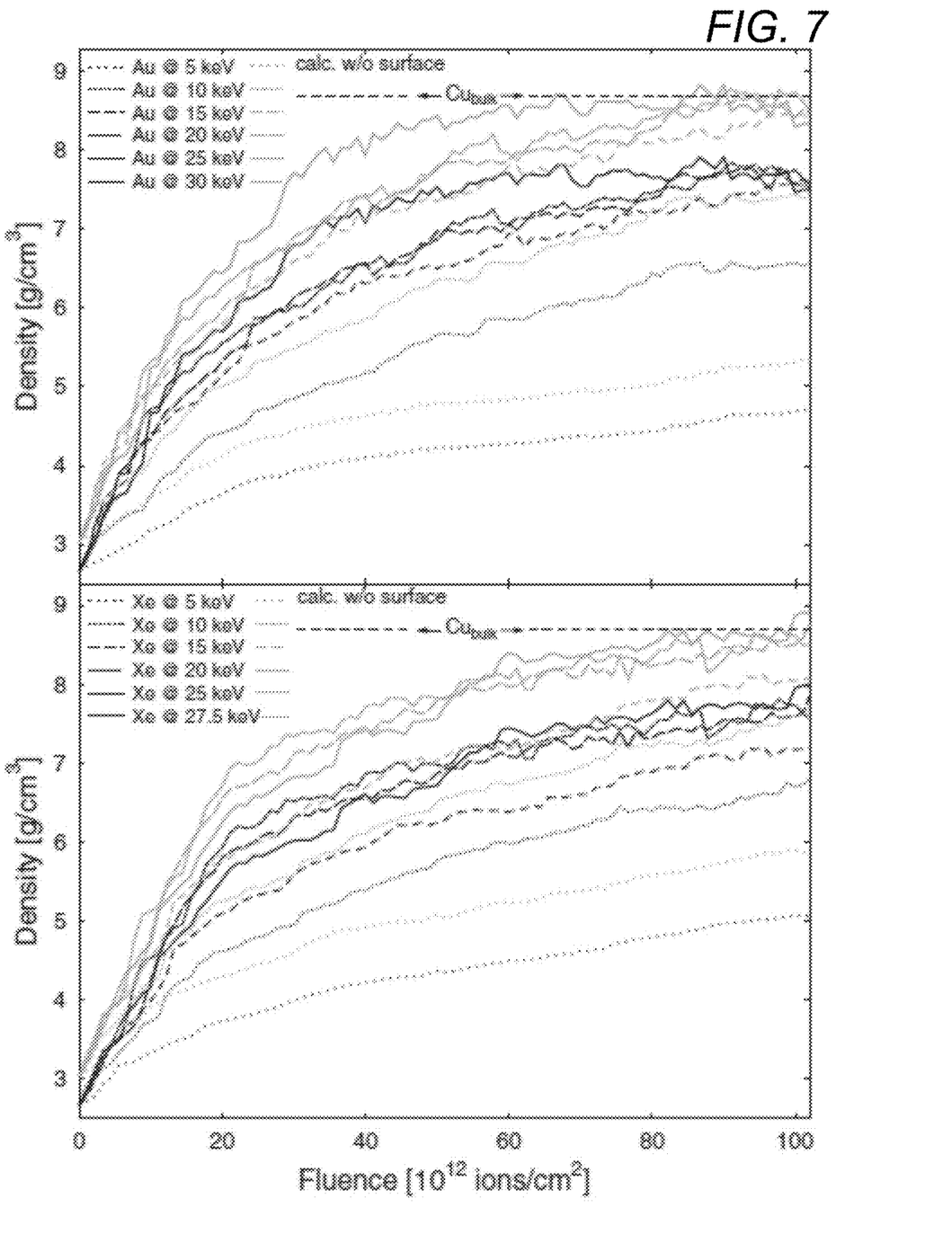
FIG. 7 is a molecular dynamics simulation of the densification of copper (Cu) films with heavy ion irradiation.

FIG. 7 shows the effect of molecular dynamics simulations of the densification of copper films using gold and xenon (Xe) ions of varying energies. The plot shows the variation of the film density as a function of irradiated ion fluence. Densities close to bulk density can be achieved at fluences between $1^{13}$ and $1^{15}$ ions/cm$^2$, which is well within the capability of commercially available ion implant systems. Furthermore, the full density is achieved faster with heavier target ions, and at lower fluences as well.

Figure 8:
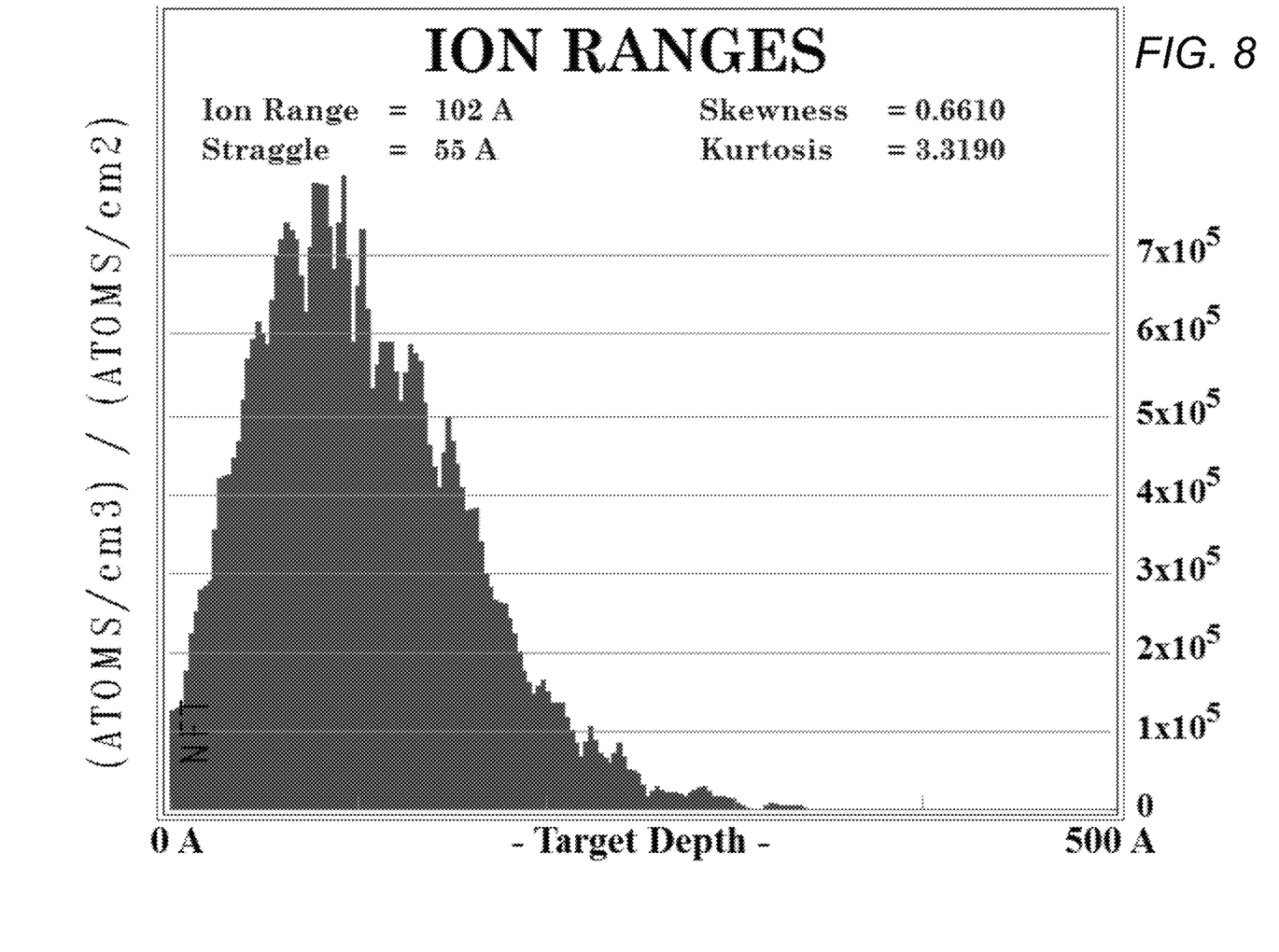
FIG. 8 shows transport of ions in matter (TRIM) simulations of a Au$^+$ ion in a film of Au.

FIG. 8 shows transport of ions in matter (TRIM) simulations of bombarded heavy ions, in this case Au$^+$ in a film of Au. The incidence energy of the incidence ion is 85 keV. The figure shows that the implant Au depth distribution can be confined tightly within the NFT film thickness (in this case 25 nm).

Figure 10:
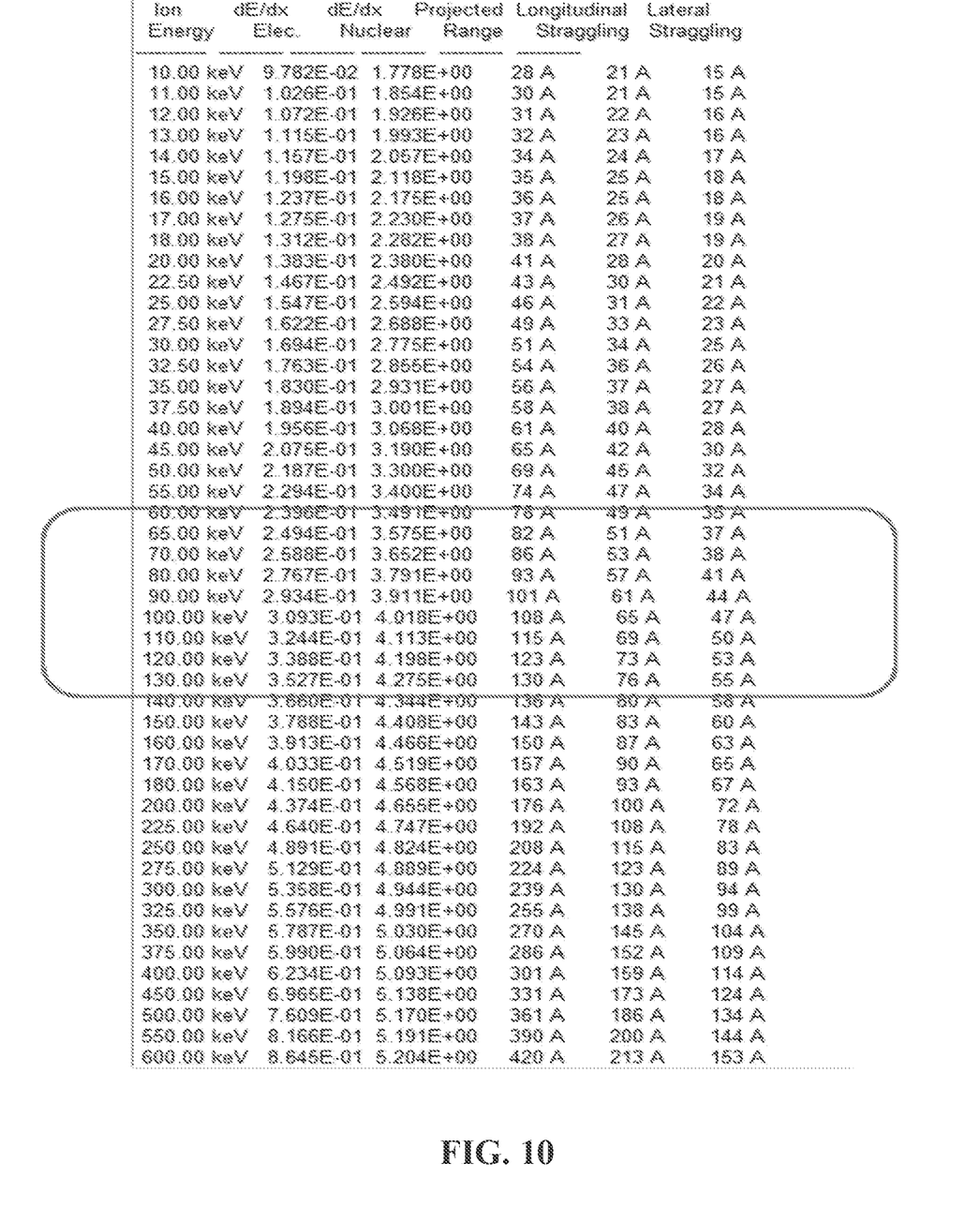
FIG. 10 is a table showing Ion Stopping Range calculations.

The table in FIG. 10 shows Ion Stopping Range calculations, again with Au ion impinging on an Au film for varying implant energies. The table shows that the extent of the implant depth and the densification depth can be tightly controlled by controlling the ion energy.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of methods of forming near field transducers and near field transducers formed thereby are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A method of forming a near field transducer (NFT), the method comprising the steps of:
   depositing a primary material;
   implanting a secondary element into the primary material, wherein both the primary material and the secondary element are chosen such that the primary material is densified via implantation of the secondary element; and
   depositing a second portion of the primary material onto the densified primary material,
   wherein the primary material and the secondary element are the same and are selected from gold, copper, rhodium, and aluminum.

2. The method according to claim 1, wherein the primary material is rhodium (Rh) and the secondary element is rhodium (Rh).

3. The method according to claim 1, wherein the primary material is gold (Au) and the secondary element is gold.

4. The method according to claim 1, wherein the primary material is copper (Cu) and the secondary element is copper (Cu).

5. The method according to claim 1 further comprising annealing after implanting the secondary element.

6. The method according to claim 1, wherein implanting the secondary element comprises patterning steps.

7. The method according to claim 1, wherein the secondary element is implanted at a fluence from about $1\times10^{11}$ to about $1\times10^{16}$ ions/cm$^2$.

8. The method according to claim 1, wherein the secondary element is implanted at an incident energy from about $1\times10^{12}$ to about $5\times10^{15}$ ions/cm$^2$.

9. A method of forming a near field transducer (NFT), the method comprising the steps of:
  depositing a primary material;
  implanting a secondary element into the primary material;
  depositing a second portion of the primary material on the implanted primary material and
  forming at least part of a near field transducer (NFT) from the implanted primary material and the second portion of the primary material,
  wherein the primary material and the secondary element are the same and are selected from gold, copper, rhodium, and aluminum.

10. The method according to claim 9, wherein the primary material and the secondary element are rhodium (Rh).

11. A method according to claim 9,
  wherein the primary material is densified via implantation of the secondary element.

12. The method according to claim 9, wherein the primary material and the secondary element are gold (Au).

13. The method according to claim 9, wherein the primary material and the secondary element are copper (Cu).

14. The method according to claim 9, wherein the primary material and the secondary element are aluminum (Al).

15. The method according to claim 9 further comprising depositing an encapsulant material after implanting the secondary element.

16. The method according to claim 9 further comprising annealing the primary material after the secondary element is implanted.

17. The method according to claim 9, wherein the secondary element is implanted at a fluence from about $1\times10^{11}$ to about $1\times10^{16}$ ions/cm$^2$.

18. The method according to claim 9, wherein the secondary element is implanted at an incident energy from about $1\times10^{12}$ to about $5\times10^{15}$ ions/cm$^2$.

19. A method of forming a near field transducer (NFT), the method comprising the steps of:
  depositing a primary material;
  implanting a secondary element into the primary material, wherein both the primary material and the secondary element are chosen such that the primary material is densified via implantation of the secondary element; and
  depositing a second portion of the primary material onto the densified primary material,
  wherein the primary material is copper and the secondary element is xenon.

* * * * *